(12) United States Patent
Nakazawa

(10) Patent No.: US 6,398,856 B1
(45) Date of Patent: Jun. 4, 2002

(54) SUBSTITUTIONAL ELECTROLESS GOLD PLATING SOLUTION, ELECTROLESS GOLD PLATING METHOD AND SEMICONDUCTOR DEVICE

(75) Inventor: Masao Nakazawa, Nagano (JP)

(73) Assignee: Shinko Electric Industries Co., Ltd. (JP)

( * ) Notice: Subject to any disclaimer, the term of this patent is extended or adjusted under 35 U.S.C. 154(b) by 0 days.

(21) Appl. No.: 09/677,468

(22) Filed: Oct. 2, 2000

(30) Foreign Application Priority Data

Oct. 4, 1999  (JP) ............................. 11-318694

(51) Int. Cl.⁷ ............................. C09D 5/00; H01B 1/00
(52) U.S. Cl. ................................... 106/1.26; 252/520.3
(58) Field of Search ....................... 252/520.3; 106/1.26

(56) References Cited

U.S. PATENT DOCUMENTS 4,792,469 A * 12/1988 Saito et al. ............... 427/443.1
4,985,076 A * 1/1991 Iacovangelo ............... 106/1.26
5,470,381 A * 11/1995 Kato et al. ................ 106/1.23
5,560,764 A * 10/1996 Wachi et al. .............. 106/1.23
5,660,619 A * 8/1997 Wachi et al. .............. 106/1.23

FOREIGN PATENT DOCUMENTS

JP          A-6-145997          5/1994

* cited by examiner

Primary Examiner—Mark Kopec
(74) Attorney, Agent, or Firm—Paul & Paul

(57) ABSTRACT

A substitutional electroless gold plating solution for applying electroless gold plating to the surface of nickel. Tetra-ethylenepentamine as a straight chain alkylamine, hydrazine 1-hydrate as a reducing agent of nickel or a nickel alloy, and gold potassium cyanide as a gold source are blended into the electroless gold plating solution. It becomes possible to minimize the drop of shear strength of a solder member such as a solder ball resulting from a heat history even when a thin film-like gold plating layer is directly formed on the surface of nickel or a nickel alloy.

2 Claims, 8 Drawing Sheets

Fig.1
(1A)
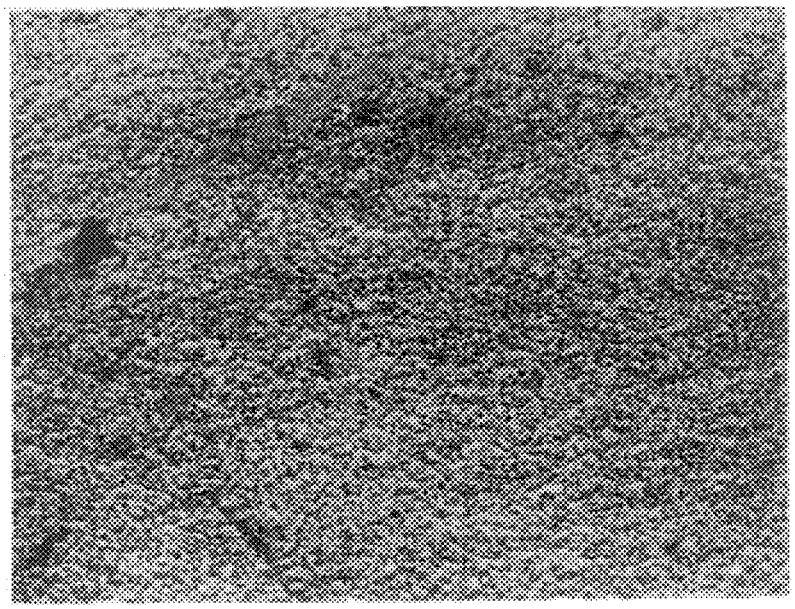
(1B)
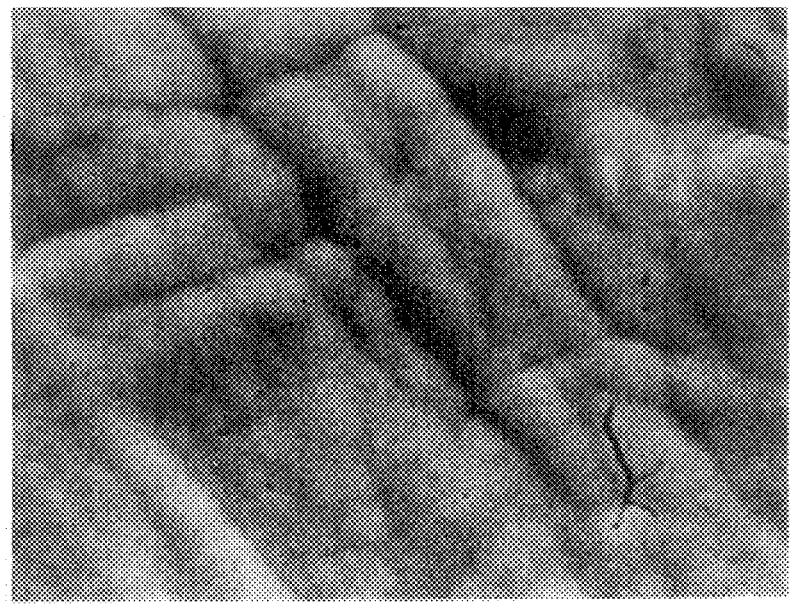

Fig.3
(3A)
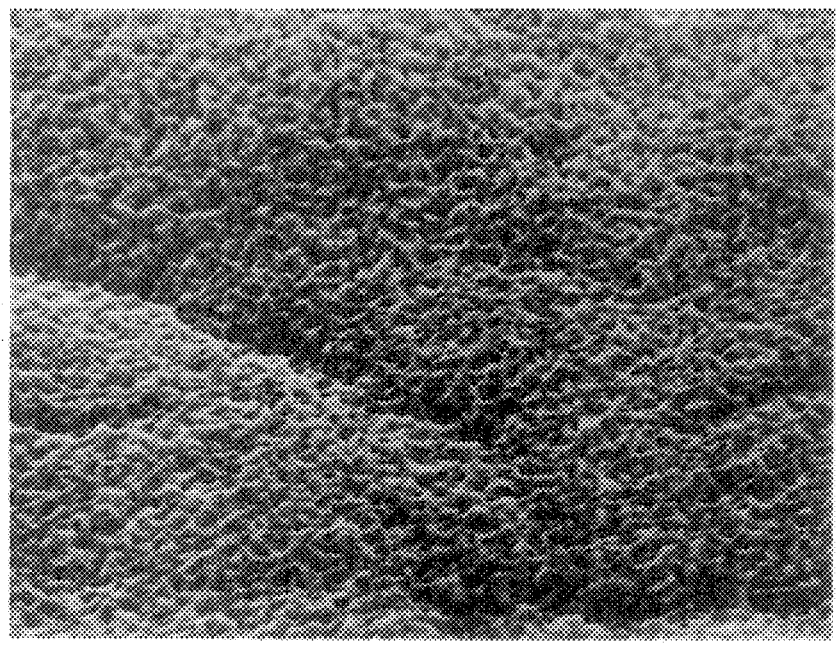
(3B)
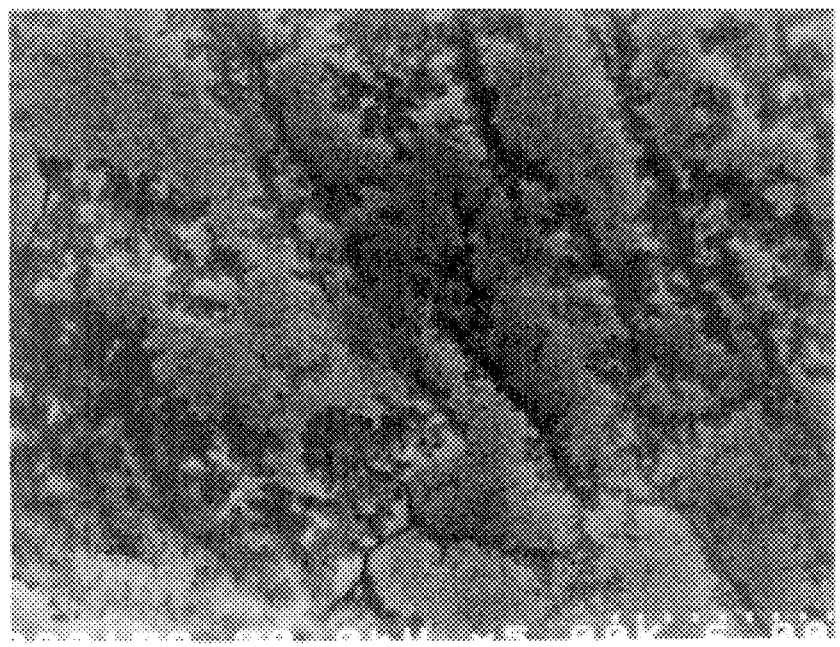

SUBSTITUTIONAL ELECTROLESS GOLD PLATING SOLUTION, ELECTROLESS GOLD PLATING METHOD AND SEMICONDUCTOR DEVICE

BACKGROUND OF THE INVENTION

1. Field of the Invention

The present invention relates to a substitutional electroless gold plating solution and an electroless gold plating method. More particularly, the present invention relates to a substitutional electroless gold plating solution and an electroless gold plating method for applying electroless gold plating to a surface of nickel or a nickel alloy. In addition, the present invention relates to a semiconductor device provided with a gold plating layer formed using the gold plating solution of the present invention.

2. Description of the Related Art

Semiconductor devices, as is illustrated in FIG. 8 which is referred to hereinafter to explain the present invention, include a so-called "BGA (Ball Grid Array)" type semiconductor device 16, in which solder balls 14 as ball-like terminals for external connection terminals are disposed on ball-like terminal mounting pads 12 as terminal mounting pads for external connection, that are disposed on one of the surface sides of a circuit substrate.

In this BGA type semiconductor device 16, the ball-like terminal mounting pads 12 are formed at the end portion of conductor patterns 22 that are wire-bonded and electrically connected to a semiconductor chip 20.

To apply the solder ball 14 to each of the ball-like terminal mounting pads 12, as illustrated in the step (A) of FIG. 9, electroplating of nickel or electroless nickel plating is applied to the surface of the ball-like terminal mounting pad 12 made of copper and formed at the end portion of the conductor pattern 22, so as to form a nickel layer 24 made of nickel or a nickel alloy. Electroless gold plating is applied further to the surface of this nickel layer 24 to form a thin film-like gold plating layer 26 having a thickness of not greater than 0.1 μm. This thin film-like gold plating 26 prevents surface oxidation of the nickel layer 24 and secures excellent solderability.

Next, as illustrated in the step (B) of FIG. 9, a solder ball is placed and caused to reflow at each predetermined position of the surface of thin film-like gold plating layer 26 in such a manner as to form a eutectic alloy between the solder and gold at the junction of the solder ball 14 and the gold plating 26. In this way, the solder ball 14 can be fixed to the nickel layer 24 formed on the surface of the ball-like terminal mounting pad 12.

In the semiconductor devices mentioned above, fixing strength (shear strength) between the solder ball 14 immediately after reflow and the nickel layer 24 formed on the surface of the ball-like terminal mounting pad 12 has a value sufficient for practical use.

However, it has been found in the prior art semiconductor devices that when heat history is applied to the solder ball 14 fixed to the ball-like terminal mounting pad 12, such as heat history that heats the solder ball 14 fixed to the ball-like terminal mounting pad 12 under a predetermined condition (at 220° C. for 45 seconds) and then cools it immediately to a room temperature, the shear strength of the solder ball 14 drops drastically.

The drastic drop of shear strength of the solder ball 14 resulting from such a heat history can be prevented when a palladium plating layer is formed between the nickel layer 24 and the thin film-like gold plating layer 26. However, the formation of the palladium plating layer between the nickel layer 24 and the thin film-like gold plating layer 26 renders the production process complicated. Moreover, since palladium is an expensive metal, the production cost of the product becomes high in addition to complication of the production process.

Therefore, means has been desired that can minimize the drop of shear strength of the solder ball 14 fixed to the nickel layer resulting from the heat history even when the thin film-like gold plating layer 26 is directly formed on the surface of the nickel layer 24 without forming the palladium plating layer.

SUMMARY OF THE INVENTION

It is therefore an object of the present invention to provide means capable of minimizing the drop of shear strength of the solder ball due to heat history even when thin film-like gold plating layer is directly formed on the surface of nickel or a nickel alloy.

That is, the first object of the present invention is to provide a gold plating solution useful in the direct application of a gold plating layer onto a surface of nickel or a nickel alloy.

The second object of the present invention is to provide a gold plating method useful in the direct application of a gold plating layer onto a surface of nickel or a nickel alloy, without causing reduction of shear strength of the solder ball.

The third object of the present invention is to provide a semiconductor device provided with a gold plating layer as one constitutional member of the terminal mounting pad.

The above objects and other objects of the present invention will be appreciated from the following detailed description of the present invention.

The inventors of the present invention have conducted the following studies to examine the cause of the drop of shear strength of the solder ball fixed to the surface of nickel or the nickel alloy (hereinafter called simply the "nickel surface" in some cases).

First, substitutional electroless gold plating was applied to the nickel surface to directly form the thin film-like gold plating layer, and the thin film-like gold plating layer was then peeled to inspect the condition of the nickel surface through an electron microscope. It has been found that the nickel surface is coarsened at the level at which shear strength of the solder ball drops greatly due to the heat history, but this surface coarseness of nickel after peeling of the thin film-like gold layer is relatively small at the level at which the drop of shear strength of the solder ball due to the heat history is small.

It has also been found that the degree of surface coarseness varies depending on the substitutional electroless gold plating solution used for forming the thin film-like gold plating layer by substitutional electroless gold plating.

Therefore, the present inventors have examined the substitutional electroless gold plating solutions that can relatively reduce the surface coarseness of nickel after the thin film-like gold plating layer is peeled. As a result, the present inventors have acquired the observation that the surface coarseness of nickel can be minimized by using a substitutional electroless gold plating solution that contains tetraethylenepentamine as a straight chain alkylamine, hypophosphite as a reducing agent of nickel or a nickel alloy, and a gold cyanide as a gold source, even when the thin film-like gold plating layer formed on the nickel surface by electroless gold plating is peeled. The present invention has been thus completed.

That is, the present invention resides in a substitutional electroless gold plating solution for applying electroless gold plating to a surface of nickel or a nickel alloy, and the substitutional electroless gold plating solution is characterized in that a straight chain alkylamine, a reducing agent of nickel or a nickel alloy, and gold cyanide as a gold source, are blended to the substitutional electroless gold plating solution.

Further, the present invention resides in a method of electroless gold plating to a surface of nickel or a nickel alloy by using the substitutional electroless gold plating solution of the present invention. That is, the electroless gold plating method is characterized in that a straight chain alklylamine, a reducing agent of nickel or a nickel alloy, and gold cyanide as a gold source are blended to the substitutional electroless gold plating solution.

In the present invention, it is preferred to use triethylenetetramine or tetraethylenepentamine as the straight chain alkylamine, and hypophosphite or a hydrazine compound as the reducing agent.

When the portion to which electroless gold plating is applied is the surface portion, that is made of nickel or a nickel alloy, of a conductor pattern formed on a circuit substrate for mounting electronic components, there can be obtained an electronic device in which solder balls as external connection terminals fixed to the conductor pattern have excellent heat resistance.

Furthermore, the present invention resides in a semiconductor device comprising a gold plating layer on a layer of nickel or a nickel alloy, said gold plating layer being formed from a substitutional electroless gold plating solution which comprises a straight chain alkylamine, nickel or a nickel alloy as a reducing agent, and a gold cyanide as a gold source.

When a thin film-like gold plating layer is formed on the surface made of nickel or a nickel alloy, that is, nickel surface, by electroless gold plating that uses the substitutional electroless gold plating solution according to the present invention and furthermore when heat history that heats the solder balls fixed to predetermined positions of this thin film-like gold plating layer by a reflow operation under a predetermined condition (at 220° C. for 45 seconds, for example) and then cools them immediately to room temperature, is applied to the solder balls, the drop of fixing strength (shear strength) of the solder balls due to such a heat history is extremely small.

The reason why the drop of the fixing strength (shear strength) of the soldered members such as the solder balls resulting from the heat history is extremely small when the substitutional electroless gold plating solution is used has not yet been clarified completely, but may be assumed to be as follows.

The thin film-like gold plating layer formed on the nickel surface by using the substitutional electroless gold plating solution according to the present invention is peeled, and the nickel surface is inspected through an electron microscope. It is found that the nickel surface is under the condition substantially equivalent to the surface condition before electroless gold plating. It can be assumed therefore that the drop of fixing strength due to the heat history can be reduced extremely remarkably because the solder member such as the solder balls is a allowed to adhere to the nickel surface by reflow.

BRIEF DESCRIPTION OF THE DRAWINGS

FIG. 1 is an electron micrograph (1A) of the surface of a thin film-like gold plating layer formed on the surface of a nickel layer by using a substitutional electroless gold plating solution according to the present invention, and an electron micrograph (1B) of the surface of the nickel layer exposed by peeling the thin film-like gold plating layer;

FIG. 3 is an electron micrograph (3A) of the surface of a thin film-like gold plating layer formed on the surface of a nickel layer by using a prior art substitutional electroless gold plating solution, and an electron micrograph (3B) of the surface of the nickel layer exposed by peeling the thin film-like gold plating layer;

DESCRIPTION OF THE PREFERRED EMBODIMENTS

Figure 2:
FIG. 2 is an electron micrograph of the surface of the nickel layer before the thin film-like gold plating layer is formed.

It is essentially necessary for the substitutional electroless gold plating solution according to the present invention to contain a straight chain alkylamine and a reducing agent of nickel or a nickel alloy.

Preferred examples of such straight chain alkylamines are ethylenediamine, diethylenetriamine, triethylenetriamine, triethylenetetramine and tetraethylenepentamine. These alkylamines may be used alone or as a mixture of two or more. Particularly preferred are triethylenetetramine and tetraethylenepentamine.

The reducing agent of nickel or a nickel alloy to be used in combination with this straight chain alkylamine is preferably potassium sulfite, hypophosphite and a hydrazine compound. Particularly preferred are hypophosphite and the hydrazine compound. Examples of such hypophosphites are alkali salts of hypophosphites such as sodium hypophosphite. A concrete example of the hydrazine compound is a hydrazine 1-hydrate.

The addition amount of such a straight chain alkalyamine and the addition amount of the reducing agent of nickel or the nickel alloy are preferably 0.1 to 100 ml/liter, more preferably 1 to 50 ml/liter, and 0.01 to 50 g/liter, more preferably 0.1 to 30 g/liter, respectively.

In addition to the straight chain alkylamine and the reducing agent of nickel or the nickel alloy, gold cyanide is added as the gold source. Gold potassium cyanide can be used suitably as the gold cyanide. The addition amount of gold cyanide is preferably 0.1 to 20 g/liter, more preferably 1 to 10 g/liter.

Any additives conventionally blended to the substitutional electroless gold plating solution, that are available commercially on the market, for example, a buffer such as citric acid or ammonium citrate, a complexing agent such as potassium ethylenediamine tetraacetate (EDTA), a grain size controller and a surfactant may be added to the plating solution.

Further, the electroless gold plating solution is preferably used at a pH range of about 6 to 7. An alkaline region should be avoided to prevent the formation of precipitation.

The substitutional electroless gold plating solution according to the present invention is used when a gold plating layer is formed on the surface of nickel or the nickel alloy by electroless gold plating.

In the practice of the present invention, the members, the surfaces of which are formed from nickel or nickel alloy, include not only metal members made of nickel or nickel alloy but also those members which have the layer of nickel or the nickel alloy on the surface of a metal member having a plating of copper formed by electroless plating or electroplating.

Particularly when the gold plating layer is formed by using the substitutional electroless plating solution according to the present invention on the conductor pattern formed on the circuit substrate for mounting semiconductor chips or semiconductor devices, the drop of the fixing strength (shear strength) resulting from the heat history of the solder balls as the external connection terminals fixed to the conductor pattern can be minimized as will be explained later, and reliability of the semiconductor device finally obtained can be improved. This is because a nickel layer made of nickel or nickel alloy is formed on the surface of the conductor pattern of copper, or the like, by electro-plating or electroless plating.

When electroless gold plating is applied to the surface of such nickel or nickel alloy (nickel surface) by using the substitutional electroless gold plating solution according to the present invention, a plating condition that is substantially similar to the condition of the commercially available electroless gold plating solution can be employed.

To prevent oxidation of the nickel surface, however, the thin film-like gold plating layer to be formed on the nickel surface is generally not greater than about 0.1 $\mu$m. Therefore, when the nickel layer is formed on the surface of the member, the thickness of the thin film-like gold plating layer is smaller than the thickness of the nickel layer.

Figure 8:
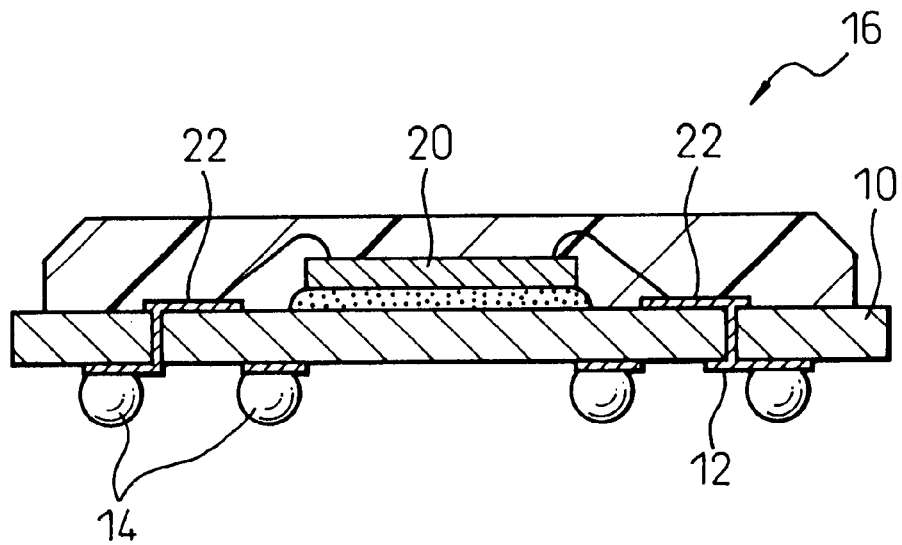
FIG. 8 is a sectional view explaining an example of the semiconductor device according to the present invention.

FIG. 8 illustrates one preferred example of the semiconductor device according to the present invention, in which a gold plating layer was incorporated according to the present invention.

The semiconductor device is a so-called BGA (Ball Grid Array) type semiconductor device 16, and solder balls 14 as ball-like terminals for external connection terminals are disposed on ball-like terminal mounting pads 12, as terminal mounting pads for external connection, that are disposed on one of the surface sides of a circuit substrate.

In this BGA type semiconductor device 16, the ball-like terminal mounting pads 12 are formed at the end portion of conductor patterns 22 that are wire-bonded and electrically connected to a semiconductor chip 20.

Figure 9:
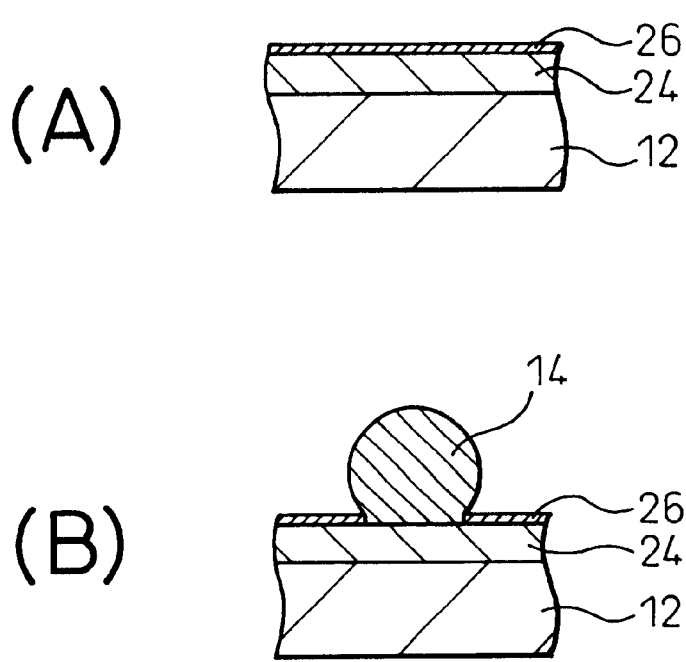
FIG. 9 is a partial sectional view for explaining, in sequence, the fixing state of a solder ball used as an external connection terminal in the semiconductor device of FIG. 8.

The solder ball 14 is applied to each of the ball-like terminal mounting pads 12 as illustrated in the steps (A) and (B), in sequence, in FIG. 9. That is, electroplating of nickel or electroless nickel plating is applied to the surface of the ball-like terminal mounting pad 12 made of copper and formed at the end portion of the conductor pattern 22, so as to form a nickel layer 24 made of nickel or a nickel alloy. Electroless gold plating is applied further to the surface of this nickel layer 24 to form a thin film-like gold plating layer 26 having a thickness of not greater than 0.1 $\mu$m. This thin film-like gold plating 26 prevents surface oxidation of the nickel layer 24 and secures excellent solderability.

Next, a solder ball is placed and caused to reflow at each predetermined position of the surface of thin film-like gold plating layer 26 in such a manner as to form a eutectic alloy between the solder and gold at the junction of the solder ball 14 and the gold plating 26 as shown in the step (B) of FIG. 9. In this way, the solder ball 14 can be fixed to the nickel layer 24 formed on the surface of the ball-like terminal mounting pad 12.

A thin film-like gold player 26 is formed on the surface of a nickel layer 24 formed on a ball-like terminal mounting pad 12 as shown in the step (A) of FIG. 9 by using the substitutional electroless gold plating solution according to the present invention. This thin film-like gold plating layer 26 is then peeled and the surface of the nickel layer 26 is inspected through an electron microscope. As a result, the surface is found substantially equivalent to the surface condition before the formation of the thin film-like gold plating layer.

Then, as shown in the step (B) of FIG. 9, a solder ball 14 is placed and caused to reflow at a predetermined position of the thin film-like gold plating layer 26 so as to form a eutectic alloy of the solder and gold at the junction between the solder ball 14 and the thin film-like gold plating layer 26. In this way, the solder ball 14 can be firmly fixed to the nickel layer 24. Moreover, even when the heat history that heats the solder ball 14 under a predetermined condition (at 220° C. for 45 seconds, for example) and immediately cools it to the room temperature is applied, the drop of the fixing strength of the solder ball 14 due to this heat history is extremely small.

On the other hand, the thin film-like gold plating layer 26 may be formed similarly on the surface of the nickel layer 24 by using a substitutional electroless gold plating solution, to which the straight chain alkylamine and/or the reducing agent of nickel or the nickel alloy according to the present invention are not blended. However, when this thin film-like gold plating layer 26 is peeled and the surface of the nickel layer 24 is inspected through the electron microscope, the surface is found coarser than the surface condition before the formation of the thin film-like gold plating layer 26. Furthermore, the fixing strength between the solder ball 14 and the nickel layer 24 is lower than the fixing strength between the solder ball 14 and the nickel layer 24 when the substitutional electroless gold plating solution according to the present invention is used. Moreover, the fixing strength of the solder ball 14 drops drastically due to the heat history.

In this connection, it will be noted that Japanese Unexamined Patent Publication (Kokai) No. 6-145997 describes an electroless gold plating solution having a composition similar to that of the electroless gold plating solution according to the present invention. However, the electroless gold plating solution described in this publication is a self-reducing type electroless gold plating solution and is entirely different from the substitutional electroless gold plating solution according to the present invention. In other words, since the substitutional electroless gold plating solution according to the present invention substitutes the gold atoms for the nickel atoms on the nickel surface made of nickel or the nickel alloy, the gold plating layer cannot be made substantially thicker after the substitution of the nickel atoms on the nickel surface by the gold atoms. For this reason, the thickness of the gold plating layer formed by this substitutional electroless gold plating solution is about 0.1 µm.

Figure 10:
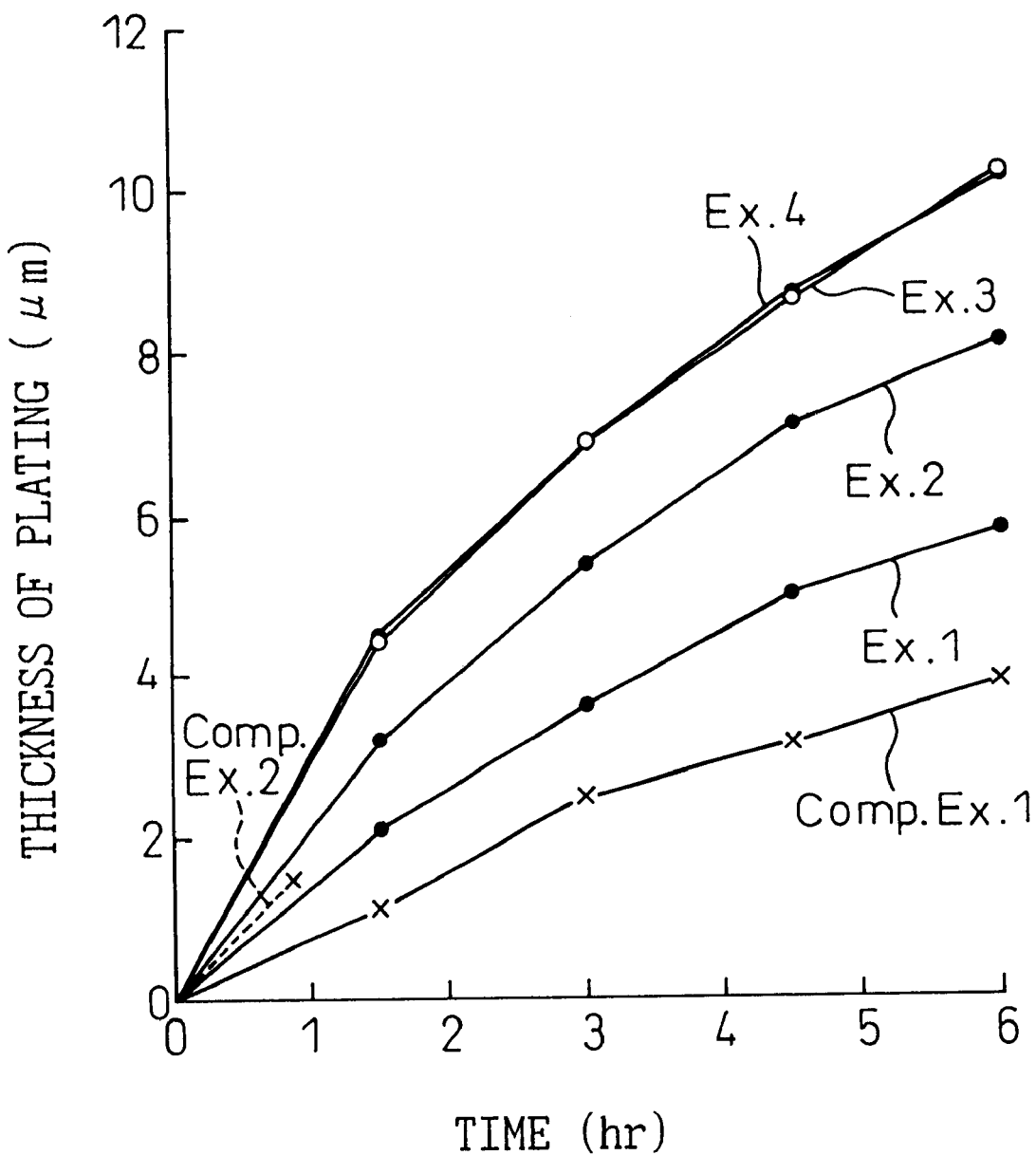
FIG. 10 is a graph attached as FIG. 1 to the specification of Japanese Unexamined Patent Publication (Kokai) No. 6-145997.

In contrast, the self-reducing type electroless gold plating solution contains a reducing agent for reducing gold. Therefore, as long as gold exists in the plating solution, the thickness of the gold plating layer can be increased. This is obvious also from the fact that the thickness of the gold plating layer by the plating operation for about 1 hour is at least 1 µm as can be seen from FIG. 1 attached to the specification of the publication described above. For the reference purpose, FIG. 1 is reproduced and attached as FIG. 10 to the specification of this application.

EXAMPLES

Hereinafter, the present invention will be explained in further detail with reference to examples thereof. Note, however, that the present invention should not be restricted to the appended examples.

Example 1

A 5 µm-thick nickel layer was formed on the entire surface of a conductor pattern of copper formed on a resin circuit substrate for a BGA type semiconductor device, by electroless nickel plating. A 0.06 µm-thick thin film-like gold plating layer was then formed on the surface of a nickel layer formed on a ball-like terminal mounting pad formed on the conductor pattern and having a land diameter of 0.6 mm, by using a substitutional electroless gold plating solution. The composition of the substitutional electroless gold plating solution and its plating condition are listed below.

| Plating solution composition: | |
| --- | --- |
| citric acid | 20 g/liter |
| ammonium citrate | 10 g/liter |
| ethylenediamine | 10 ml/liter |
| EDTA | 1 g/liter |
| potassium sulfite | 40 g/liter |
| gold potassium cyanide | 3 g/liter |
| Plating condition: | |
| 85° C., 20 minutes | |

In the plating solution described above, ethylenediamine was used for the straight chain alkalyamine and potassium sulfite was used for the reducing agent of nickel or the nickel alloy. Further, the plating solution contained gold potassium cyanide for the gold cyanide as the gold source.

Next, a solder ball having a ball diameter of 0.76 mm was put on, and caused to reflow on, a ball-like terminal mounting pad, and the solder ball was fixed to the surface of the nickel layer that formed the surface layer of the ball-like terminal mounting pad. The fixing strength (ball shear strength) of the ball so fixed was measured by using a ball shear tester ("DPRSX-2T", a product of Imada K. K.). This measurement of the fixing strength of the solder ball using the ball shear tester was conducted for twenty solder balls fixed to the ball-like terminal mounting pads. As a result, the mean value of the ball shear strength of the solder balls was found 1.81 kg (maximum value =1.94 kg, minimum value =1.74 kg).

Further, the heat history that heated twenty solder balls to 220° C. for 45 seconds and cooled them immediately to the room temperature was applied to solder balls fixed to ball-like terminal mounting pads. The mean shear strength of twenty solder balls after the application of such a heat history was 1.72 kg (maximum value =1.82 kg, minimum value =1.62 kg).

Examples 2 to 8 & Comparative Examples 1 to 3

The shear strength of the solder balls was measured in the same way as in Example 1 with the exception that ethylenediamine used as the straight chain alkylamine and/or pottasium sulfite used as the reducing agent for nickel or the nickel alloy in the substitutional electroless gold plating solution in Example 1 were changed as listed in Table 1. Further, the shear strength of the solder balls after the application of the heat history to the solder balls fixed to the ball-like terminal mounting pads was measured in the same way as in Example 1. The measurement values of the shear strength of the solder balls were also tabulated in Table 1.

TABLE 1

| No. of Example | straight chain alkylamine | reducing agent | shear strength (kg) before heat history | shear strength (kg) after heat history |
| --- | --- | --- | --- | --- |
| Ex. 2 | diethylene-triamine | potassium sulfite | mean 1.80, max. 1.94, min. 1.74 | mean 1.72, max. 1.82, min. 1.62 |
| Ex. 3 | triethylene-tetramine | potassium sulfite | mean 1.95, max. 2.08, min. 1.64 | mean 2.10, max 2.15, min. 2.02 |
| Ex. 4 | tetraethylene-pentamine | potassium sulfite | mean 1.95, max. 2.11, min. 1.78 | mean 2.04, max. 2.18, min. 1.98 |
| Ex. 5 | ethylene-diamine | sodium hypo-phosphite | mean 1.71, max. 1.94, min. 1.58 | mean 1.59, max. 1.78, min. 1.45 |
| Ex. 6 | ethylene-diamine | hydrazine 1-hydrate | mean 1.93, max. 1.93, min. 1.71 | mean 1.63, max. 1.92, min. 170 |
| Ex. 7 | triethylene-tetramine | hydrazine 1-hydrate | mean 1.86, max. 2.06, min. 1.71 | mean 1.78, max. 1.92, min. 1.70 |

TABLE 1-continued

| No. of Example | straight chain alkylamine | reducing agent | shear strength (kg) before heat history | shear strength (kg) after heat history |
|---|---|---|---|---|
| Ex. 8 | tetraethylene-pentamine | sodium hypo-phosphite | mean 2.02, max. 2.15, min. 1.89 | mean 1.92, max. 2.00, min. 1.87 |
| Comp Ex. 1 | none | none | mean 1.47, max. 1.68, min. 0.93 | mean 0.78, max. 2.10, min. 0.22 |
| Comp Ex. 2 | ethylene-diamine | none | mean 1.52, max. 1.81, min. 1.25 | mean 1.11, max 1.42, min. 0.87 |
| Comp Ex. 3 | none | potassium sulfite | mean 1.41, max. 1.67, min. 1.16 | mean 1.51, max. 1.85, min. 0.96 |

As can be seen clearly from Table 1, the shear strength of the solder ball immediately after fixing of the solder ball was higher in Examples 2 to 8 than in Comparative Examples 1 to 3 and moreover, the drop of the solder ball shear strength after the heat history was much lower.

Example 9

A 5 μm-thick nickel layer was formed by electroless nickel plating on the entire surface of a conductor pattern of copper that was formed on a resin circuit substrate for a BGA type semiconductor device. FIG. 2 shows an electron micrograph (5,000 ×) of the surface of this nickel layer.

Next, a 0.06 μm-thick thin film-like gold plating layer was formed on the nickel layer formed on a ball-like terminal mounting pad having a land diameter of 0.6 mm and formed on the conductor pattern, by using the substitutional electroless gold plating solution of Example 6. The micrograph (1A) of FIG. 1 shows an electron micrograph (20,000 ×) of the thin film-like gold plating layer so formed.

Thereafter, the thin film-like gold plating layer was peeled by using "Enstrip Au78" (a product of Meltex Co.) as a peeling solution. The micrograph (1B) of FIG. 1 shows an electron micrograph (5,000 ×) of the surface of the exposed nickel layer. It can be understood by comparing (1B) of FIG. 1 with FIG. 2 that the thin film-like gold plating layer could be formed without coarsening the surface of the nickel layer, by using the substitutional electroless gold plating solution of Example 6.

The above procedure was repeated, however, for comparison purposes, and the substitutional electroless gold plating solution of Comparative Example 1 was used. The micrograph (3A) of FIG. 3 shows an electron micrograph (20,000 ×) of the thin film-like gold plating layer formed. It can be understood by comparing (3A) of FIG. 3 with (1A) of FIG. 1 that coarser crystals were formed in the thin film-like gold plating layer formed by using the substitutional electroless gold plating solution of Comparative Example 1 than in the gold plating layer formed by using the substitutional electroless gold plating solution of Example 6.

The micrograph (3B) of FIG. 3 shows an electron micrograph (20,000 ×) of the surface of the exposed nickel layer after the thin film-like gold plating layer formed by using the substitutional electroless gold plating solution of Comparative Example 1 was peeled. It can be understood by comparing (3B) of FIG. 3 with (1B) of FIG. 1 that the surface of the nickel layer was coarsened much more when the substitutional electroless gold plating solution of Comparative Example 1 was used than when the substitutional electroless gold plating solution of Example 6 was used.

Example 10

Figure 4:
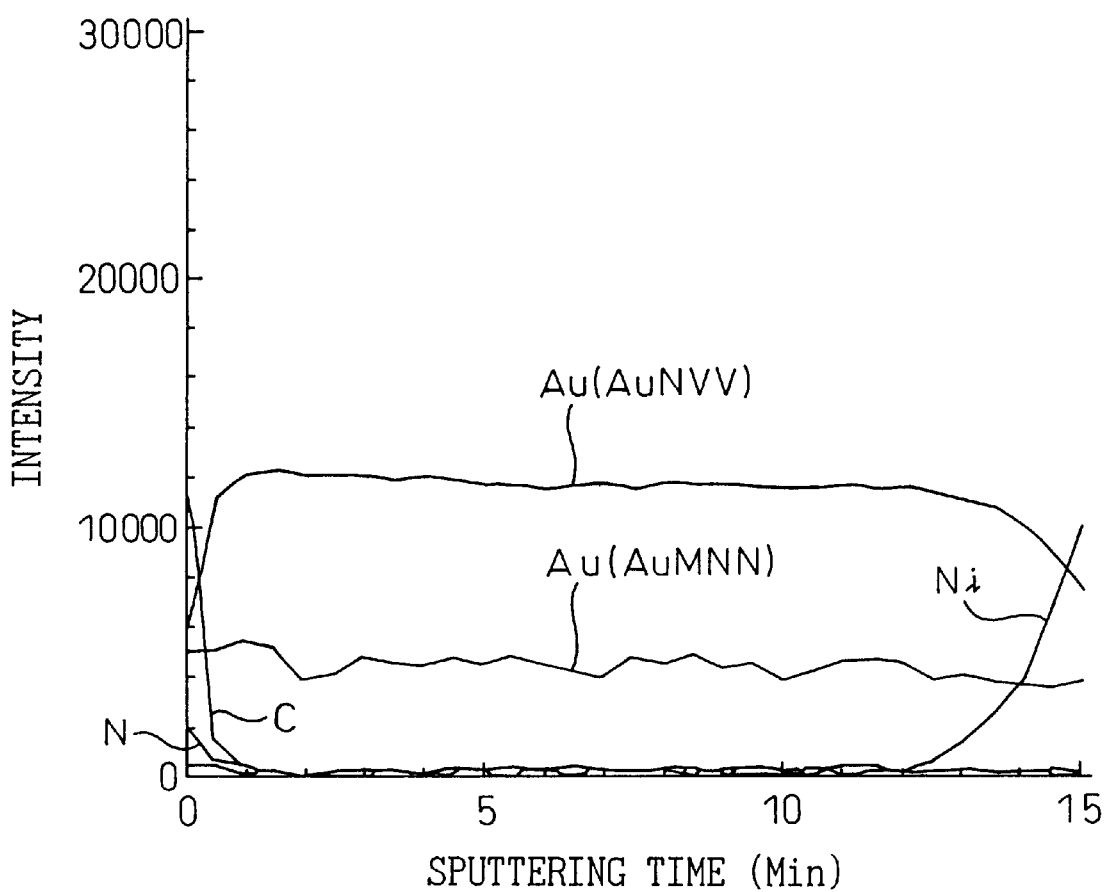
FIG. 4 is a graph showing the result of measurement of a thin film-like gold plating layer formed on the surface of a nickel layer by using a substitutional electroless gold plating solution according to the present invention, by Auger spectroscopic analysis.
Figure 5:
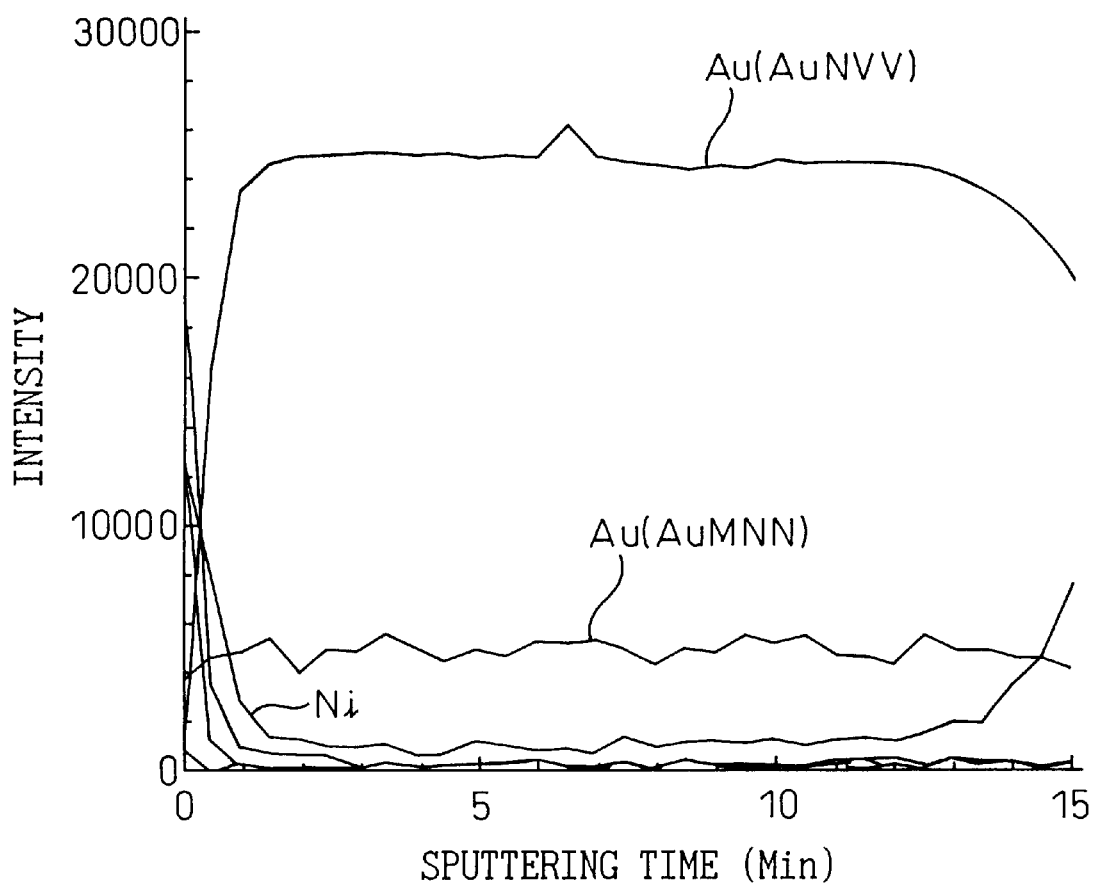
FIG. 5 is a graph showing the result of measurement of a thin film-like gold plating layer formed on the surface of a nickel layer by using a prior art substitutional electroless gold plating solution, by Auger spectroscopic analysis.

FIGS. 4 and 5 show the measurement result when the surface layers of the ball-like terminal mounting pads formed by Example 6 and Comparative Example 1, respectively, were measured by the Auger spectroscopic analysis. FIG. 4 shows the result of analysis of the surface layer of the ball-like terminal mounting pad formed by Example 6, and FIG. 5 shows the result of analysis of the surface layer of the ball-like terminal mounting pad formed by Comparative Example 1. In FIGS. 4 and 5, the abscissa represents the depth from the surface of the ball-like terminal mounting pad, and the ordinate represents the amount of the metal depending on a predetermined depth from the surface of the ball-like terminal mounting pad.

In the surface layer of the ball-like terminal mounting pad formed by Example 6 and shown in FIG. 4, nickel did not exist in the surface of the thin film-like gold plating layer. However, in the surface layer of the ball-like terminal mounting pad formed by Comparative Example 1 and shown in FIG. 5, nickel existed in the surface of the gold plating layer. Consequently, solderability of the ball-like terminal mounting pad of Comparative Example 1 was inferior to that of the ball-like terminal mounting pad of Example 6.

Example 11

A 5 μm-thick nickel layer was formed on the entire surface of a conductor pattern of copper formed on a resin circuit substrate for a BGA type semiconductor device, by electroless nickel plating. A 0.06 μm-thick thin film-like gold plating layer was then formed on the surface of a nickel layer formed on a ball-like terminal mounting pad formed on the conductor pattern and having a land diameter of 0.6 mm, by using a substitutional electroless gold plating solution. The composition of the substitutional electroless gold plating solution and its plating conditions are listed below.

| Plating solution composition: | |
|---|---|
| citric acid | 20 g/liter |
| ammonium citrate | 10 g/liter |
| tetraethylenepentamine | 10 ml/liter |
| hydrazine monohydrate | 10 ml/liter |
| gold potassium cyanide | 3 g/liter |
| Plating conditions: | |
| 85° C., 20 minutes | |

Next, a solder ball having a ball diameter of 0.76 mm was put on, and caused to reflow on, a ball-like terminal mounting pad, and the solder ball was fixed to the surface of the nickel layer that formed the surface layer of the ball-like terminal mounting pad. The fixing strength (ball shear strength) of the ball so fixed was measured by using a ball shear tester ("DPRSX-2T", a product of Imada K. K.). This measurement of the fixing strength of the solder ball using the ball shear tester was conducted for twenty solder balls fixed to the ball-like terminal mounting pads, under different conditions, i.e., an ordinary state (OS) and three vapour states (VPS1, VPS2 and VPS3). The measurement results plotted in FIG. 6 were thus obtained, in which "MAX.", "AVG." and "MIN." represent the maximum value, mean value and minimum value of the ball shear strength, respectively.

The above procedure was repeated, however, for comparison purposes, and the following plating solution composition and plating conditions were used.

| Plating solution composition: | |
|---|---|
| citric acid | 20 g/liter |
| ammonium citrate | 10 g/liter |
| gold potassium cyanide | 3 g/liter |
| Plating conditions: | |
| 85° C., 20 minutes | |

Figure 7:
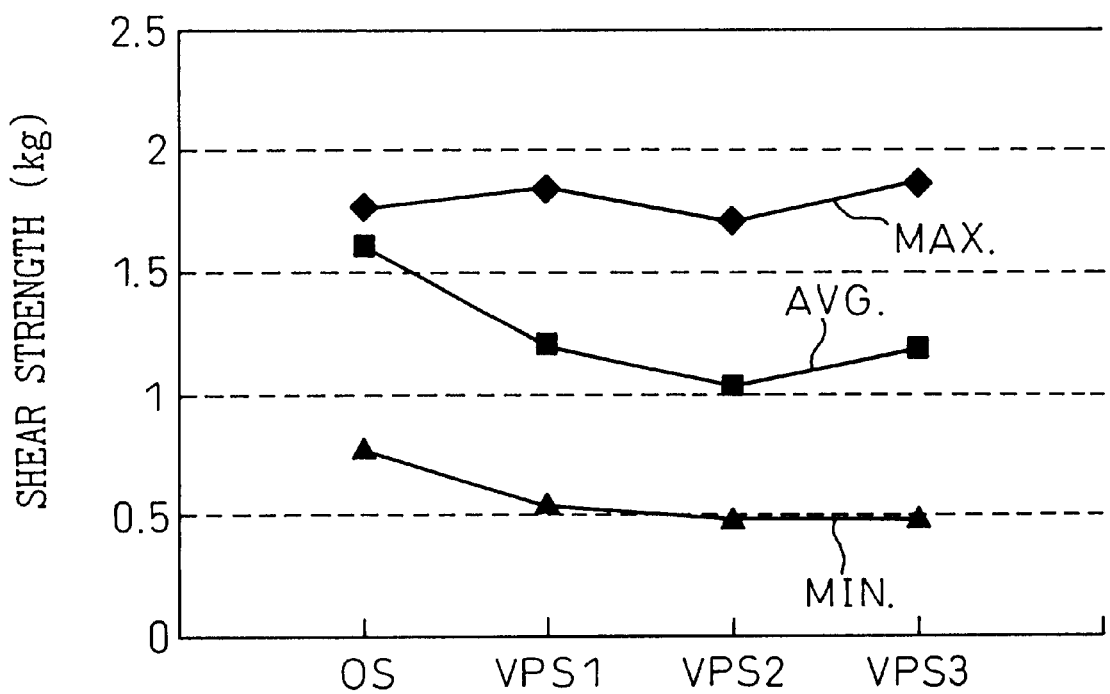
FIG. 7 is a graph showing a variation of the shear strength of the solder balls as a function of the applied heat history for the comparative example.

The fixing strength (ball shear strength) of the fixed ball was measured in accordance with the above-described manner to obtain the results plotted in FIG. 7.

Figure 6:
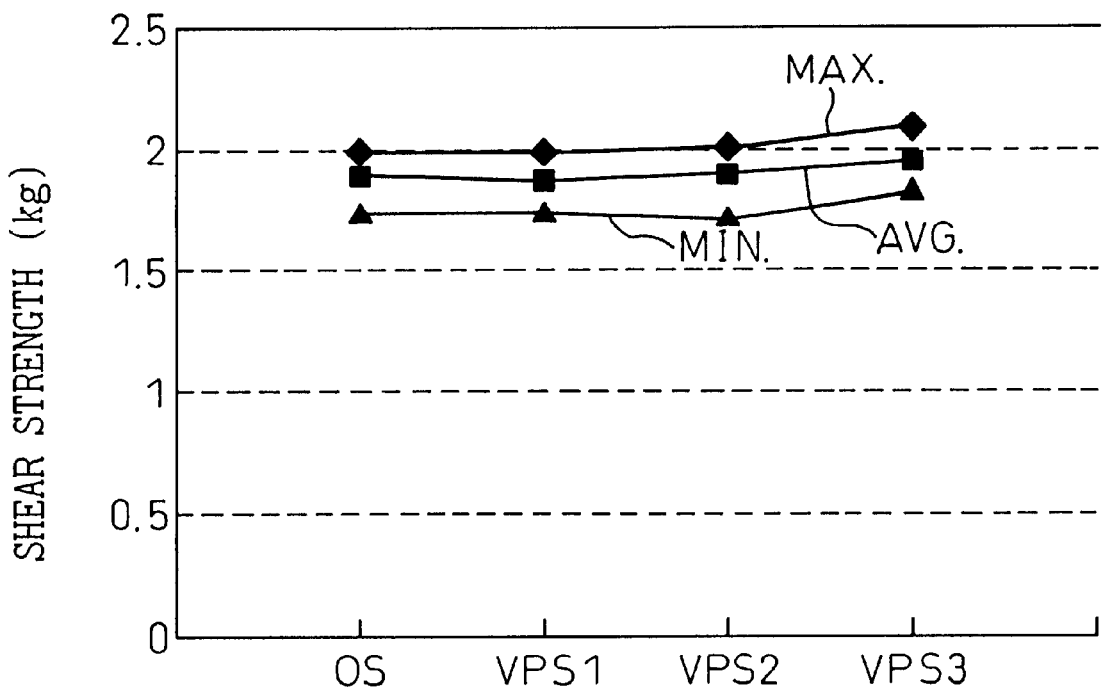
FIG. 6 is a graph showing a variation of the shear strength of the solder balls as a function of the applied heat history for the example of the present invention.

It can be understood by comparing the results of FIG. 6 with those of FIG. 7 that satisfactory and stable results can be obtained if the electroless gold plating solution of the present invention is used in the formation of thin film-like gold plating layer.

After completion of the measurement of the fixing strength, a bonding area of the ball for all samples was observed using a metal inspection microscope to evaluate an exposure degree of the underlying nickel plating from the gold plating layer. As a result, it was found for the samples according to the present invention that an exposure area of the nickel plating is remarkably small due to good bonding between the nickel plating and the gold plating layer.

As can be seen from the detailed description of the present invention, when the thin film-like gold plating layer is formed on the nickel surface by electroless gold plating using the substitutional electroless gold plating solution according to the present invention and furthermore when the heat history that heats the solder ball under the predetermined condition (to 220° C. for 45 seconds, for example) and immediately cools it to room temperature is applied to the solder ball put on and fixed to a predetermined position of the thin film-like gold plating layer by the reflow operation, the drop of the fixing strength (shear strength) of the solder ball due to this heat history is extremely small.

Therefore, when the thin film-like gold plating layer is formed on the ball-like terminal mounting pad of the conductor pattern formed over the circuit substrate for the semiconductor device by using the substitutional electroless gold plating solution according to the present invention, the solder ball as the external connection terminal can be fixed to the ball-like terminal mounting pad by the reflow operation. In consequence, a semiconductor device can be obtained in which the external connection terminal thus fixed has excellent heat resistance, and the reliability of the semiconductor device can also be improved.

What is claimed is:

1. A substitutional electroless gold plating solution for applying electroless gold plating to a surface of nickel or a nickel alloy, in which a straight chain alkylamine, a nickel or nickel alloy reducing agent selected from the group consisting of hypophosphite and a hydrazine compound, and gold cyanide as a gold source are blended into said substitutional electroless gold plating solution.

2. A substitutional electroless gold plating solution according to claim 1, wherein said straight chain alkylamine is ethylenediamine, diethylenetriamine, triethylenetriamine, triethylenetetramine, tetraethylenepentamine or a mixture thereof.

* * * * *